United States Patent
Yamagami

(10) Patent No.: US 12,074,467 B2
(45) Date of Patent: Aug. 27, 2024

(54) SECONDARY BATTERY CHARGING SYSTEM

(71) Applicant: SANYO Electric Co., Ltd., Daito (JP)

(72) Inventor: Shimpei Yamagami, Osaka (JP)

(73) Assignee: PANASONIC ENERGY CO., LTD., Moriguchi (JP)

( * ) Notice: Subject to any disclaimer, the term of this patent is extended or adjusted under 35 U.S.C. 154(b) by 679 days.

(21) Appl. No.: 17/267,226

(22) PCT Filed: Aug. 1, 2019

(86) PCT No.: PCT/JP2019/030201
§ 371 (c)(1),
(2) Date: Feb. 9, 2021

(87) PCT Pub. No.: WO2020/044932
PCT Pub. Date: Mar. 5, 2020

(65) Prior Publication Data
US 2021/0313816 A1  Oct. 7, 2021

(30) Foreign Application Priority Data
Aug. 31, 2018  (JP) .................................. 2018-162827

(51) Int. Cl.
*H02J 7/00* (2006.01)
*G01R 31/382* (2019.01)
(Continued)

(52) U.S. Cl.
CPC .......... *H02J 7/0048* (2020.01); *G01R 31/382* (2019.01); *G01R 31/392* (2019.01);
(Continued)

(58) Field of Classification Search
CPC .............................. H02J 7/0048; G01R 31/392
(Continued)

(56) References Cited

U.S. PATENT DOCUMENTS

| 6,664,764 B1 | 12/2003 | Odaohhara |
| 2003/0076074 A1* | 4/2003 | Kawai ................... H02J 7/0069 320/136 |
| 2009/0021217 A1* | 1/2009 | Nakazawa ........ H02J 7/007182 320/134 |

(Continued)

FOREIGN PATENT DOCUMENTS

| JP | 2001-327092 A | 11/2001 |
| JP | 2008-252960 A | 10/2008 |

(Continued)

OTHER PUBLICATIONS

International Search Report dated Oct. 8, 2019, issued in counterpart International Application No. PCT/JP2019/030201 (1 page).

*Primary Examiner* — Nghia M Doan
(74) *Attorney, Agent, or Firm* — WHDA, LLP

(57) ABSTRACT

A charging system for a secondary battery capable of minimizing a reduction in the capacity retention rate and the charge-discharge efficiency of a secondary battery. A charging system according to an aspect of the present disclosure includes a secondary battery, a charger that charges the secondary battery, a unit that calculates a charge capacity of the secondary battery, and a charge control unit that controls the charger to perform a first charging step of charging the secondary battery until a first voltage is reached, and a second charging step of charging the secondary battery at a constant voltage of the first voltage. The charge control unit terminates charging when the charge capacity of the secondary battery reaches a charge termination capacity set in a range less than a full charge capacity that is based on the first voltage of the secondary battery.

3 Claims, 4 Drawing Sheets

(51) Int. Cl.
  *G01R 31/392* (2019.01)
  *H01M 10/44* (2006.01)
  *H01M 10/48* (2006.01)
  *H01M 10/0525* (2010.01)

(52) U.S. Cl.
  CPC .......... *H01M 10/44* (2013.01); *H01M 10/48* (2013.01); *H01M 10/0525* (2013.01)

(58) Field of Classification Search
  USPC ........................................................ 320/132
  See application file for complete search history.

(56) References Cited

U.S. PATENT DOCUMENTS

| | | | | |
|---|---|---|---|---|
| 2011/0112782 | A1* | 5/2011 | Majima | H01M 10/48 324/427 |
| 2012/0086368 | A1* | 4/2012 | Kawabuchi | B60L 58/24 320/134 |
| 2013/0069598 | A1 | 3/2013 | Tanaka et al. | |
| 2014/0333265 | A1* | 11/2014 | Kinjo | G01R 31/3835 320/134 |
| 2016/0028254 | A1 | 1/2016 | Honoki et al. | |
| 2016/0301226 | A1* | 10/2016 | Matsumura | H02J 7/0029 |
| 2017/0366023 | A1* | 12/2017 | Tanaka | H01M 10/425 |
| 2021/0184278 | A1* | 6/2021 | Kataoka | H01M 10/482 |

FOREIGN PATENT DOCUMENTS

| | | | |
|---|---|---|---|
| JP | 2013-65481 A | 4/2013 | |
| JP | 2016-195495 A | 11/2016 | |
| WO | 2014/147973 A1 | 9/2014 | |

\* cited by examiner

SECONDARY BATTERY CHARGING SYSTEM

TECHNICAL FIELD

The present disclosure relates to a charging system for a secondary battery.

BACKGROUND ART

In recent years, secondary batteries have been used for a variety of purposes, such as for power storage devices mounted in an electric vehicle, large power storage devices for solar power generation devices or wind power generation devices, power storage devices for home power generators, and power storage devices for home use and as backup power supplies for data servers. A secondary battery used in such power storage devices degrades with charge-discharge cycles, and therefore the charge-discharge efficiency decreases. A reduction in charge-discharge efficiency is related to the operational costs of a system such as an electric vehicle or a solar power generation device including a power storage device. Therefore, it is desirable to improve charge-discharge efficiency.

PTL 1 describes a charging system that calculates, as the degree of degradation, the ratio of a reduction in actual capacity from the initial capacity of a secondary battery with respect to the initial capacity and reduces at least one of the charge voltage and the charge current to be applied to the second battery as the degree of degradation increases. This makes it possible to minimize degradation of the secondary battery.

PTL 2 describes a technique that calculates the degradation rate of a secondary battery and restricts the charge-discharge conditions, for example, by lowering the upper-limit charge current, the upper-limit discharge current, or the upper-limit charge voltage during charging if the current degradation rate exceeds the previous degradation rate by a predetermined value or more. This makes it possible to improve the charge-discharge cycle characteristics of the secondary battery such as the capacity retention rate.

PTL 3 describes a charging system that sets, based on a calculated degree of change in full charge capacity of a secondary battery, a first charge current value or a first charge power value and charges the secondary battery. When the secondary battery is at the end of life, this system sets a second charge current value less than the first charge current value, or a second charge power value less than the first charge power value, and charges the secondary battery. This makes it possible to charge the secondary battery even when the degradation is advanced and to continue using the secondary battery.

CITATION LIST

Patent Literature

PTL 1: Japanese Published Unexamined Patent Application No. 2008-252960
PTL 2: Japanese Published Unexamined Patent Application No. 2013-65481
PTL 3: International Publication No. 2014/147973

SUMMARY OF INVENTION

Technical Problem

A known common charging system controls charging by initially setting the charge rate, for example, the charge current and the charge power, and the charge termination voltage. Since the cycle characteristics of a secondary battery are affected by the charge conditions, the charge conditions need to be appropriately adjusted. As the capacity retention rate of the secondary battery decreases with cycles, the charge rate of the secondary battery per unit cell capacity is increased relative to that in the early cycles. As a result, the reduction in the capacity retention rate and the charge-discharge efficiency of the secondary battery is accelerated. Even if the degree of degradation of the secondary battery is calculated and the charge rate and the charge termination voltage are reduced in accordance therewith as described in PTL 1 to 3, the effects are limited.

An object of the present disclosure is to provide a charging system for a secondary battery capable of minimizing a reduction in the capacity retention rate and the charge-discharge efficiency of a secondary battery.

Solution to Problem

A charging system for a secondary battery according to the present disclosure includes: a secondary battery; a charger that charges the secondary battery; a unit that calculates a charge capacity of the secondary battery; and a charge control unit that controls the charger to perform a first charging step of charging the secondary battery until a first voltage is reached, and a second charging step of charging the secondary battery at a constant voltage of the first voltage, in which the charge control unit terminates charging when the charge capacity of the secondary battery reaches a charge termination capacity set in a range less than a full charge capacity that is based on the first voltage of the secondary battery.

Advantageous Effects of Invention

According to the charging system for a secondary battery of the present disclosure, it is possible to minimize a reduction in the capacity retention rate and the charge-discharge efficiency of a secondary battery.

DESCRIPTION OF EMBODIMENTS

Hereinafter, an embodiment of the present disclosure will be described with reference to the accompanying drawings. In the following description, the specific materials, numerical values, and the like are given by way of example to facilitate understanding of the present disclosure and may be appropriately changed according to the specifications of a charging system. Further, if the following description includes a plurality of embodiments or modifications, it is originally intended to use appropriate combinations of features of the embodiments or the modifications.

Figure 1:
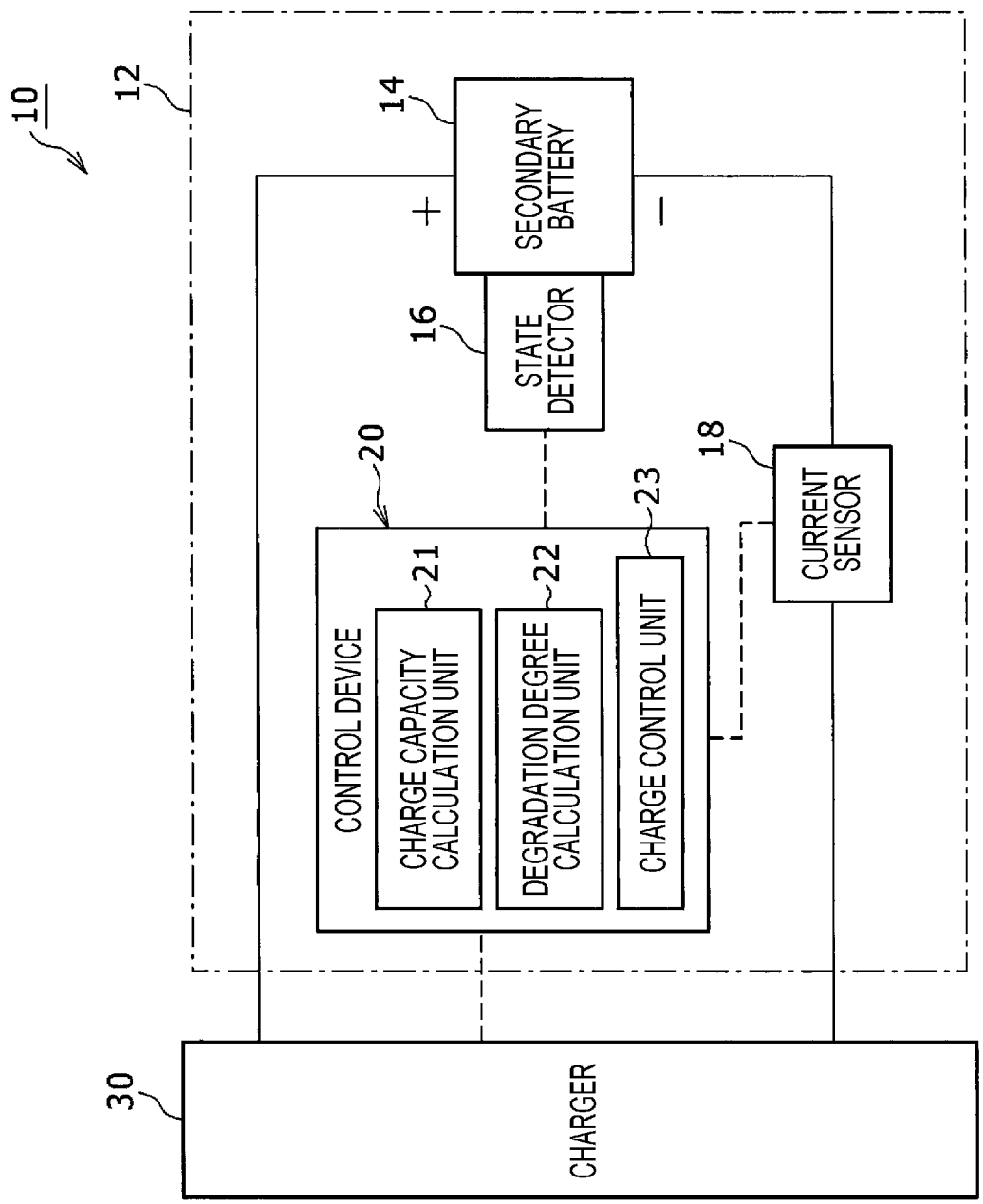
FIG. 1 is a configuration diagram of a charging system for a secondary battery of an exemplary embodiment.

FIG. 1 is a configuration diagram of a charging system 10 of the embodiment. The charging system 10 includes a battery pack 12 and a charger 30 electrically connected to the battery pack 12. The battery pack 12 and the charger 30 are connected at their terminals on each of the positive side and the negative side. Further, a control device 20 of the battery pack 12, which is described below, is connected to the charger 30 via a connector.

[Battery Pack]

First, the battery pack 12 will be described. The battery pack 12 includes a secondary battery 14 and the control device 20. For example, the secondary battery is a non-aqueous electrolyte secondary battery such as a lithium-ion battery. A lithium-ion secondary battery includes a plurality of lithium-ion battery cells connected in series, in parallel, or in a combination of the two. Each cell includes a positive electrode plate, a negative electrode plate, and a separator disposed therebetween. The positive electrode plate includes a positive electrode active material such as a lithium transition metal composite oxide. The negative electrode plate includes a negative electrode active material such as a carbon material including graphite. The separator is made of a resin such as polypropylene and polyethylene. Note that the secondary battery 14 may be a secondary battery other than a lithium-ion secondary battery.

The secondary battery 14 includes a state detector 16 including a temperature sensor, a voltage sensor, and the like and detecting the state of the secondary battery 14. The temperature sensor detects a temperature of each cell and transmits the detected temperature to the control device 20 described below. The voltage sensor detects an inter-terminal voltage of each cell and transmits the voltage data to the control device 20.

A current sensor 18 is connected to a negative terminal of the secondary battery 14. The current sensor 18 detects an energizing current of the secondary battery 14 and transmits the current data to the control device 20.

The control device 20 is configured to include, for example, an IC. The control device 20 includes an A/D converter (not illustrated), a charge capacity calculation unit 21, a degradation degree calculation unit 22, a charge control unit 23, and a communication unit (not illustrated).

The A/D converter converts the current data of the secondary battery 14 detected by the current sensor 18 into digital values. The A/D converter also converts the data of the detected temperature values of the secondary battery 14 detected by the temperature sensor and the voltage data of the secondary battery 14 detected by the voltage sensor into digital values. Each set of data converted into digital values is transmitted to the charge capacity calculation unit 21 and the charge control unit 23.

The charge capacity calculation unit 21 computes and calculates, based on the current data, the temperature data, and the voltage data provided from the A/D converter, the charge capacity (charge amount) of the secondary battery 14 at the current point in time. The charge capacity calculation unit 21 may compute and calculate, based on, for example, the integrated values of the current data and the voltage data, the charge capacity of the secondary battery 14 at the current point in time. The charge capacity calculation unit 21 may calculate a state of charge (SOC) representing the ratio of the actual charge capacity to the full charge capacity of the secondary battery 14, based on an open circuit voltage (OCV), a closed circuit voltage (CCV), or an integrated charge-discharge capacity of the secondary battery 14 or based on a combination of these, and may calculate, based on the SOC, the charge capacity. The calculated charge capacity is used to determine during charge whether the charge capacity has reached the charge termination capacity. As will be described in detail below, the initially set charge termination capacity may be changed in accordance with the degree of degradation of the secondary battery 14 with charge-discharge cycles.

The degradation degree calculation unit 22 calculates a degree of degradation of the secondary battery 14. For example, the degradation degree calculation unit 22 can calculate, based on the measurement result of the charge capacity or the discharge capacity of the secondary battery 14, the degree of degradation with respect to the initial capacity. The corresponding relationship between the change in OCV of the secondary battery 14 in a predetermined SOC or DC resistance during discharge from the initial state and the degree of degradation may be calculated in advance. Thus, the degradation degree calculation unit 22 can calculate, based on the measurement result of the OCV or the DC resistance of the secondary battery 14, the degree of degradation. The degree of degradation may be calculated by a combination of two or more of these calculation methods. The degree of degradation is used to change the charge termination capacity described below.

It is preferable that the degree of degradation be calculated when a predetermined trigger condition is satisfied. For example, when the number of charge-discharge cycles of the secondary battery 14 from the initial point in time or from the last calculation of the degree of degradation reaches a predetermined number of cycles, the trigger condition is regarded as being satisfied, and the degree of degradation is calculated. The trigger condition may include the drive time, the number of times charged, the integrated value of the charge capacity, and the integrated value of the discharge capacity of the secondary battery 14, in addition to the number of cycles. The trigger condition may include two or more conditions, which may be used as AND conditions or OR conditions.

The charge control unit 23 controls the charger 30 by outputting a control signal of the charge power value, the charge current value, or the charge voltage value to the charger 30 via the communication unit and the connector. Alternatively, the control device 20 may calculate the required charge amount of the secondary battery 14 upon receiving a charge command. This is because, in consideration of actual use, charge is often performed when the secondary battery 14 is in a completely discharged state. For example, the charge control unit 23 may control the charger 30 so as to charge the secondary battery 14 by the amount corresponding to the difference between the charge termination capacity described below and the actual charge capacity calculated based on the current SOC.

The charge control unit 23 includes, specifically, a microcomputer including a CPU and memory. The memory of the microcomputer includes program memory and working memory. The program memory stores a program for calculating, based on current data, voltage data, and temperature data, the charge capacity and the degree of degradation of a secondary battery, and other operation programs. The charge control method performed by the charge control unit 23 will be described below in detail.

[Charger]

The charger 30 includes a control IC, a charge current supply circuit, and the like. The control IC communicates with the control device 20 of the battery pack 12 so as to control the charge current supply circuit. The charge current supply circuit increases or decreases the charge current to adjust, based on a signal from the control IC, the charge current when charging the secondary battery 14. The charger 30 charges the secondary battery 14 by constant power charging (CP charging) or constant current charging (CC charging) and by constant voltage charging (CV charging). The control IC may be omitted, and the control device of the battery pack 12 may control the charge current supply circuit of the charger 30 so as to increase or decrease the charge current to adjust the charge current.

[Load]

A load (not illustrated) such as a motor is connected in parallel with the charger 30 to the secondary battery 14. The control device 20 also has a discharge control function and controls the electrical circuit so as to supply power from the secondary battery 14 to the load upon receiving a discharge command.

[Charge Control Method]

The following describes the charge control method performed by the control device 20. The charge control unit 23 of the control device 20 controls the charger 30 to perform a first charging step and a second charging step.

Figure 2:
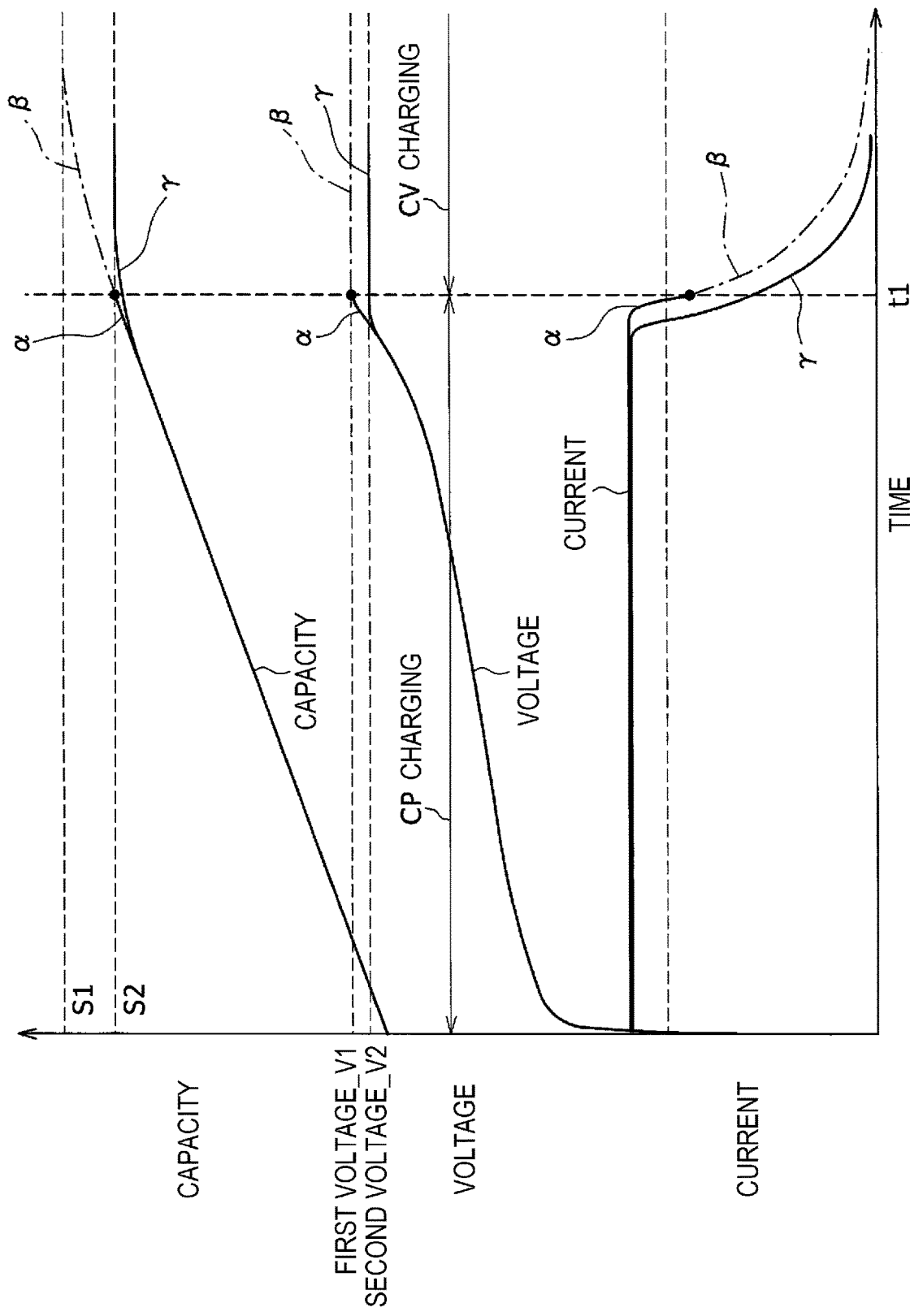
FIG. 2 is a view illustrating changes in charge capacity, charge voltage, and charge current over time for explaining a charge control method in the charging system of the exemplary embodiment.

FIG. 2 is a view illustrating changes in charge capacity, charge voltage, and charge current over time for explaining the charge control method in the charging system 10 of the exemplary embodiment. In FIG. 2, the solid line α represents the embodiment, in which constant power charging (CP charging) of the first charging step is performed, and thereafter the constant voltage charging (CV charging) of the second charging step is performed. Note that the one-dot chain line β and the solid line γ in FIG. 2 represent Comparative Examples 1 and 2, respectively. In FIG. 2, the current is maintained constant by CP charging. However, in reality, the current gradually decreases as the voltage increases.

In the first charging step, constant power charging (CP charging) is performed to charge the secondary battery 14 until a first voltage V1, which is a recommended charge voltage value for the secondary battery 14, is reached. The term "recommended charge voltage" as used herein refers to the maximum charge voltage determined based on the specifications of the secondary battery 14. For example, in a lithium-ion battery using a carbon material and a lithium transition metal composite oxide as a negative electrode active material and a positive electrode active material, respectively, the recommended charge voltage value per unit cell is often 4.2 to 4.3 V. In the first charging step, the secondary battery 14 may be charged by constant current charging (CC charging) until the first voltage V1 is reached.

In the second charging step, constant voltage charging (CV charging) is performed to charge the secondary battery 14 at a constant voltage of the first voltage V1.

Further, the charge control unit 23 terminates the charging at the time (time t1) when the charge capacity of the secondary battery 14 reaches a charge termination capacity S2 set in a range less than a full charge capacity S1 that is based on the first voltage V1 of the secondary battery 14. The solid line a in FIG. 2 illustrates the case where the charge capacity of the secondary battery 14 reaches the charge termination capacity S2 immediately after CV charging is started. As illustrated in FIG. 2, it is preferable that charging of the secondary battery 14 be terminated after CV charging is started.

The "charge termination capacity S2" is determined based on a full charge capacity that is based on a second voltage V2 less than the first voltage V1. The full charge capacity based on the second voltage V2 can be measured by performing CP charging or CC charging until the battery voltage of the secondary battery 14 reaches the second voltage V2 and then performing CV charging at the second voltage V2 until the current value is sufficiently attenuated. It is preferable that the current value used as the condition for terminating CV charging be set between 0.02 C to 0.05 C. The charge termination capacity S2 may be determined in advance before the secondary battery 14 is installed in the charging system 10.

The second voltage V2 is, for example, set in a range greater than or equal to 95% and less than or equal to 99% of the first voltage V1. For example, when the first voltage V1 is 4.2 V per unit cell, the second voltage V2 is around 4.0 to 4.15 V per unit cell. In the case of the charging based on the first voltage V1, by setting the second voltage V2 in this range, it is easy to set the charge termination capacity for terminating charging before the current value is sufficiently attenuated after the start of CV charging. Therefore, the actual charge capacity of the secondary battery 14 is not greatly reduced compared to the full charge capacity based on the first voltage value V1 representing the recommended charge voltage according to the specifications.

Further, referring back to FIG. 1, the degradation degree calculation unit 22 calculates the degree of degradation when the above trigger condition is satisfied. The charge control unit 23 changes and reduces the charge termination capacity in accordance with the calculated degree of degradation. For example, the ratio of a reduction in charge capacity from the initial point in time to the time when the trigger condition is satisfied, with respect to the charge capacity at the initial point in time, can be calculated as the degree of degradation. The charge termination capacity S2 after the change is calculated by using an expression $(1-G) \times S2\_1$, in which $G$ ($0 \leq G < 1$) is the calculated degree of degradation, and $S2\_1$ is the charge termination capacity S2 before the change. In the charge-discharge cycles after the above trigger condition is satisfied, charging is controlled such that the charging is terminated when this changed charge termination capacity S2 is reached.

Figure 3:
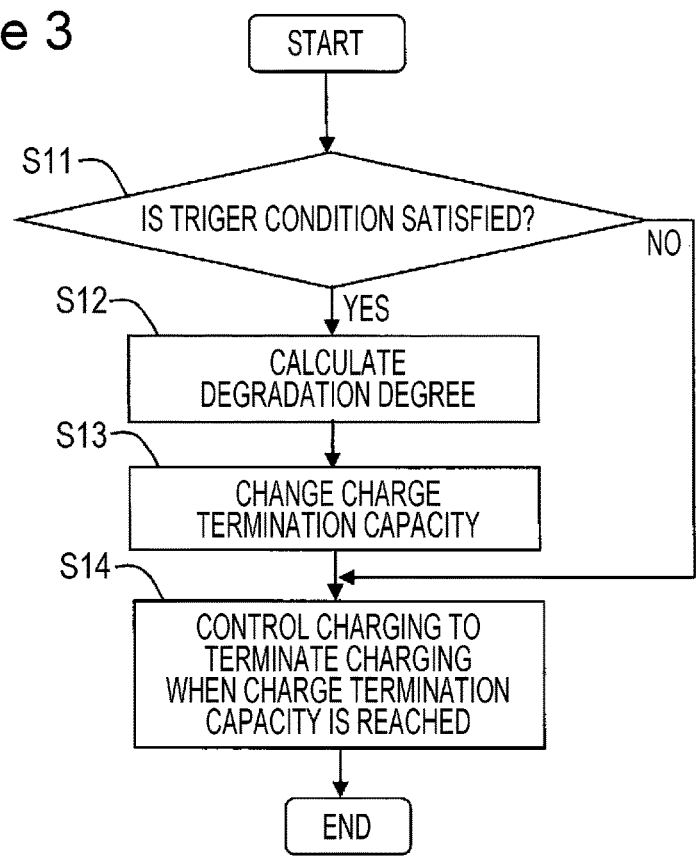
FIG. 3 is a flowchart illustrating the charge control method in the charging system of the exemplary embodiment.

FIG. 3 is a flowchart illustrating the charge control method in the charging system 10 of the exemplary embodiment. The process illustrated in FIG. 3 is executed by the control device 20. First, when charging starts, the charge control unit 23 determines, in step S11, whether the trigger condition is satisfied, such as whether the number of charge-discharge cycles of the secondary battery 14 has reached a predetermined number of cycles. If the determination in step S11 is affirmative (YES), the process proceeds to step S12. If the determination in step S11 is negative (NO), the process proceeds to step S14.

In step S12, the degradation degree calculation unit 22 calculates the degree of degradation. Then, in step S13, the charge control unit 23 changes the charge termination capacity S2 in accordance with the calculation result of the degree of degradation.

In step S14, the charge control unit 23 controls the charging so as to terminate the charging when the charge termination capacity S2 is reached. Prior to the trigger condition being satisfied, the initially set charge termination capacity S2 is used.

According to the charging system 10 described above, in the case of performing charging at the first voltage V1, the charging is terminated when the charge termination capacity S2 less than the full charge capacity S1 based on the first voltage V1 is reached. Therefore, it is possible to minimize a reduction in capacity retention rate and charge-discharge efficiency with charge-discharge cycles. Further, since charging such as CP charging and CV charging is performed based on the first voltage V1, the charging time required for reaching a certain charge capacity is reduced compared to the case where charging is performed based on a voltage lower than the first voltage V1. By changing and reducing the charge termination capacity S2 in accordance with the degree of degradation, the cycle characteristics are further improved.

In the example described above, the charge termination capacity S2 is calculated based on the degree of degradation calculated by the degradation degree calculation unit 22. Alternatively, a charge-discharge cycle for measuring the full charge capacity based on the second voltage V2 lower than the first voltage V1 may be performed every time the number of charge-discharge cycles reaches a predetermined number of cycles, and the degradation degree calculation unit 22 may calculate the degree of degradation from the full charge capacity. In this case, the measured full charge capacity may be used as the charge termination capacity S2. Example 1 described hereinafter is configured as described above.

EXAMPLES

Example 1

First, the configuration of a unit cell of the secondary battery 14 of Example 1 will be described. A wound non-aqueous electrolyte secondary battery was used as the unit cell of the secondary battery 14.

[Preparation of Positive Electrode Plate]

A lithium-nickel-cobalt-aluminum composite oxide represented by $LiNi_{0.88}Co_{0.09}Al_{0.03}O_2$ was used as a positive electrode active material. Then, 100 parts by mass of $LiNi_{0.88}Co_{0.09}Al_{0.03}O_2$ (positive electrode active material), 1 part by mass of acetylene black, and 0.9 parts by mass of polyvinylidene fluoride (PVDF) (binder) were mixed in a solvent of N-methyl-2-pyrrolidone (NMP) to prepare a positive electrode mixture slurry. Then, the positive electrode mixture slurry in a paste form was uniformly applied to both sides of an elongated positive electrode current collector made of aluminum foil, dried in a dryer to remove NMP, and then rolled to a predetermined thickness with a roll press machine to obtain an elongated positive electrode plate. Further, the rolled positive electrode plate was cut into a predetermined electrode size to prepare a positive electrode plate. Further, an uncoated portion not coated with the active material was formed at the longitudinal center of the positive electrode plate, and an aluminum positive electrode lead was connected to the uncoated portion by ultrasonic welding.

[Preparation of Negative Electrode Plate]

A hundred parts by mass of graphite powder as a negative electrode active material, 1 part by mass of styrene-butadiene rubber (SBR) as a binder, and 1 part by mass of carboxymethyl cellulose (CMC) as a thickener were mixed. Then, the mixture was dispersed in water to prepare a negative electrode mixture slurry. The negative electrode mixture slurry was uniformly applied to both sides of a negative electrode current collector made of copper foil, dried in a dryer, and then rolled to a predetermined thickness with a roll press machine to obtain an elongated negative electrode plate. Then, the elongated negative electrode plate was cut into a predetermined electrode size to prepare a negative electrode plate. Further, a negative electrode lead made of a nickel-copper-nickel clad material was connected by ultrasonic welding to an uncoated portion of the negative electrode plate at a position to be an inner peripheral portion of a wound electrode group.

[Preparation of Non-Aqueous Electrolyte]

Five parts by mass of vinylene carbonate (VC) was added to 100 parts by mass of a mixed solvent in which ethylene carbonate (EC) and dimethyl carbonate (DMC) were mixed at a volume ratio of EC:DMC=1:3. Further, $LiPF_6$ was dissolved at 1.5 mol/L to prepare a non-aqueous electrolyte.

[Preparation of Electrode Group]

The prepared positive electrode plate and negative electrode plate were spirally wound with a polyolefin-based resin separator interposed therebetween to prepare a wound electrode group. In this step, the negative electrode current collector made of copper foil was exposed at the outermost periphery of the electrode group.

[Preparation of Unit Cell of Secondary Battery]

A disk-shaped insulating plate was inserted into a bottomed cylindrical case main body, and the electrode group was inserted on the upper side thereof. In this step, the electrode group was placed in the case main body such that the negative electrode current collector was placed in contact with the inner surface of the cylindrical portion of the case main body. The negative electrode lead connected to the negative electrode plate was connected by welding to the inner bottom surface of the case main body. Then, an insulating plate was inserted into the case main body on the upper side of the electrode group, and a predetermined amount of the prepared non-aqueous electrolyte was injected into the case main body in which the electrode group was disposed. Then, the positive electrode lead connected to the positive electrode plate was connected by welding to a sealing body, and the sealing body was inserted into the opening of the case main body with a gasket interposed therebetween. The opening end of the case main body was caulked to prepare a unit cell of a sealed non-aqueous electrolyte secondary battery. Further, the used sealing body includes a circular terminal plate made of an aluminum material and having a thin portion as a valve element. The thinnest portion was formed at the center of the thin portion of the terminal plate. Then, a predetermined rupture disk and the insulating plate were connected to the terminal plate to prepare the sealing body.

The recommended charge voltage for the unit cell of the secondary battery 14 described above is 4.2 V. The initial full charge capacity at 4.2 V corresponding to the first voltage V1 is 4400 mAh (15.8 Wh), and the initial full charge capacity at 4.1 V corresponding to the second voltage V2 is 4000 mAh (14.4 Wh).

[Charge-Discharge Control]

The following describes charge-discharge control performed by the control device 20. Table 1 illustrates the modes of charging and discharging, the maximum voltage during charging, whether the charge rate and the discharge rate were changed, and the charge termination capacity in Examples 1 to 5 and Comparative Examples 1 to 3.

TABLE 1

| | | | CHARGE | | | | DISCHARGE | |
|---|---|---|---|---|---|---|---|---|
| | | CYCLE | MODE | MAX. VOLTAGE | RATE CHANGE | TERMINATION CAPACITY | MODE | RATE CHANGE |
| EXAMPLE 1 40 REPETITIONS | 1ST PATTERN | 1 | CP-CV | 4.1 V | NO | FULL CHARGE CAPACITY | CP | NO |
| | 2ND PATTERN | 2-25 | CP-CV | 4.2 V | NO | S2 | | |
| EXAMPLE 2 40 REPETITIONS | 1ST PATTERN | 1 | CP-CV | 4.1 V | NO | FULL CHARGE CAPACITY | CP | NO |
| | 2ND PATTERN | 2-25 | CP-CV | 4.2 V | YES | S2 | | |
| EXAMPLE 3 40 REPETITIONS | 1ST PATTERN | 1 | CP-CV | 4.1 V | NO | FULL CHARGE CAPACITY | CP | NO |
| | 2ND PATTERN | 2-25 | CP-CV | 4.2 V | YES | S2 | | YES |
| EXAMPLE 4 40 REPETITIONS | 1ST PATTERN | 1 | CP-CV | 4.15 V | NO | FULL CHARGE CAPACITY | CP | NO |
| | 2ND PATTERN | 2-25 | CP-CV | 4.2 V | NO | S2 | | |
| EXAMPLE 5 40 REPETITIONS | 1ST PATTERN | 1 | CP-CV | 4.1 V | NO | FULL CHARGE CAPACITY | CP | NO |
| | 2ND PATTERN | 2-25 | CP-CV | 4.15 V | NO | S2 | | |
| COMPARATIVE EXAMPLE 1 | — | 1-1000 | CP-CV | 4.2 V | NO | FULL CHARGE CAPACITY | CP | NO |
| COMPARATIVE EXAMPLE 2 | — | 1-1000 | CP-CV | 4.1 V | NO | FULL CHARGE CAPACITY | CP | NO |
| COMPARATIVE EXAMPLE 3 40 REPETITIONS | 1ST PATTERN | 1 | CP-CV | 4.1 V | NO | FULL CHARGE CAPACITY | CP | NO |
| | 2ND PATTERN | 2-25 | CP-CV | 4.1V | YES | FULL CHARGE CAPACITY | | |

As illustrated in the row of Example 1 of Table 1, charge-discharge cycles of a first pattern and a second pattern were alternately performed by the control device 20. The charge-discharge cycles were started with the first pattern. One cycle of the first pattern was performed, and then 24 cycles of the second pattern were performed. A set of 25 charge-discharge cycles of the first pattern and the second pattern in total was repeated 40 times. The charge-discharge cycle of the first pattern is performed to determine the full charge termination capacity S2 for the subsequent charge-discharge cycles of the second pattern. The charge-discharge conditions of the first pattern and the second pattern are as follows.

In the first pattern, a charge-discharge cycle was performed to measure the full charge capacity based on the second voltage V2 of the secondary battery 14. That is, the secondary battery 14 was charged at a constant power of 0.5 E (7.9 W per unit cell) (CP charging) until the battery voltage of the secondary battery 14 reached the second voltage V2 (4.1 V per unit cell) and was then charged at a constant voltage of the first voltage V1 (CV charging) until the current value was attenuated to 0.05 C (220 mA per unit cell). The charge capacity measured in this step is the full charge capacity based on the second voltage V2 of the secondary battery 14. After the charging, the secondary battery 14 was discharged at a constant power of 0.5 E (7.9 W per unit cell) (CP discharging) until the battery voltage reached the discharge termination voltage (3 V per unit cell).

In the second pattern, the full charge capacity of the secondary battery 14 based on the second voltage V2 calculated in the immediately preceding charge-discharge cycle of the first pattern was used as the charge termination capacity S2. That is, the secondary battery 14 was charged at a constant power of 0.5 E (7.9 W per unit cell) (CP charging) until the battery voltage of the secondary battery 14 reached the first voltage V1 (4.2 V per unit cell) and was then charged at a constant voltage of the first voltage V1 (CV charging). The charging was terminated when the charge capacity of the secondary battery 14 reached the charge termination capacity S2. The discharge conditions in the subsequent step are the same as the discharge conditions of the first pattern.

Example 2

In Example 2, in addition to the charge-discharge cycle condition of Example 1, the charge rate during CP charging was reduced in accordance with the degree of degradation, every time the charge-discharge cycles of the second pattern were started. Specifically, first, a reduction in charge capacity was calculated by subtracting the full charge capacity of the first pattern immediately preceding the charge-discharge cycle of the second pattern from the initial full charge capacity of the first pattern. Then, the ratio of the reduction in charge capacity to the initial full charge capacity of the first pattern was calculated as the degree of degradation of the secondary battery. The charge rate of the second pattern was calculated by using an expression $(1-G) \times 0.5$ E, representing the charge rate of 0.5 E in the first charge-discharge cycle multiplied by $(1-G)$, in which G is the calculated degree of degradation ($0 \leq G < 1$). In Example 2, other configurations and the control method are the same as those of Example 1.

Example 3

In Example 3, in addition to the charge-discharge cycle condition of Example 2, the discharge rate during CP discharging was also reduced in accordance with the degree of degradation, every time the charge-discharge cycles of the second pattern were started. Specifically, G representing the degree of degradation of the secondary battery was calculated with the same method as in Example 2. That is, the discharge rate of the second pattern was calculated by using an expression (1−G)×0.5 E, representing the discharge rate of 0.5 E in the first charge-discharge cycle multiplied by (1−G). In Example 3, other configurations and the control method are the same as those of Example 1.

Example 4

In Example 4, the second voltage V2 in the charge-discharge cycle of the first pattern in Example 1 was changed from 4.1 V to 4.15 V per unit cell, and the full charge capacity obtained in this case was used as the charge termination capacity S2 of the second pattern in the subsequent step. In Example 4, other configurations and the control method are the same as those of Example 1.

Example 5

In Example 5, the first voltage V1 in the charge-discharge cycle of the second pattern in Example 1 was changed from 4.2 V to 4.15 V per unit cell. In Example 5, other configurations and the control method are the same as those of Example 1.

Comparative Example 1

In Comparative Example 1, charge-discharge cycles were performed on a secondary battery prepared in the same manner as in Example 1, under the same conditions as those of the charge-discharge cycle of the first pattern of Example 1 except that the second voltage V2 (4.1 V per unit cell) was changed to the first voltage V1 (4.2 V per unit cell). This charge-discharge cycle was repeated 1,000 times. In Comparative Example 1, other configurations and the control method are the same as those of Example 1.

Comparative Example 2

In Comparative Example 2, charge-discharge cycles were performed on a secondary battery prepared in the same manner as in Example 1, under the same conditions as those of the charge-discharge cycle of the first pattern of Example 1. This charge-discharge cycle was repeated 1,000 times. In Comparative Example 2, other configurations and the control method are the same as those of Example 1.

Comparative Example 3

In Comparative Example 3, in addition to the charge-discharge cycle conditions of Comparative Example 2, the charge rate during CP charging was reduced in accordance with the degree of degradation of the secondary battery. The details are as follows. The charge-discharge cycles of Comparative Example 2 were divided into the first pattern of one cycle and the second pattern of 24 cycles as in the examples. G representing the degree of degradation of the secondary battery was calculated with the same method as in Example 2. That is, the charge rate of the second pattern was calculated by using an expression (1−G)×0.5 E, representing the charge rate of 0.5 E in the first charge-discharge cycle multiplied by (1−G).

[Test Results]

Table 2 illustrates the results of the capacity retention rate and the charge-discharge efficiency in the thousandth cycle as the cycle characteristics at 25° C. obtained by performing tests based on Examples 1 to 5 and Comparative Examples 1-3 described above. The capacity retention rate was calculated as the ratio (percentage) of the discharge capacity in the thousandth cycle to the discharge capacity in the second cycle, and the charge-discharge efficiency was calculated as the ratio (percentage) of the discharge power amount to the charge power amount in the thousandth cycle.

TABLE 2

| | CAPACITY RETENTION RATE | CHARGE-DISCHARGE EFFICIENCY |
|---|---|---|
| EXAMPLE 1 | 85.0% | 93.5% |
| EXAMPLE 2 | 85.2% | 93.6% |
| EXAMPLE 3 | 85.2% | 93.7% |
| EXAMPLE 4 | 84.5% | 93.3% |
| EXAMPLE 5 | 85.4% | 93.8% |
| COMPARATIVE EXAMPLE 1 | 73.3% | 90.6% |
| COMPARATIVE EXAMPLE 2 | 82.0% | 92.5% |
| COMPARATIVE EXAMPLE 3 | 82.3% | 92.7% |

As illustrated in Table 1, in Comparative Example 2, since the maximum voltage during charging is less than that of Comparative Example 1, the charge capacity in the first cycle is reduced. However, as illustrated in Table 2, in Comparative Example 2, the capacity retention rate and the charge-discharge efficiency are improved compared to Comparative Example 1. Further, in Comparative Example 3, the charge rate is reduced in accordance with the degree of degradation every predetermined number of cycles, and therefore the capacity retention rate and the charge-discharge efficiency are slightly improved compared to Comparative Example 2.

Figure 4:
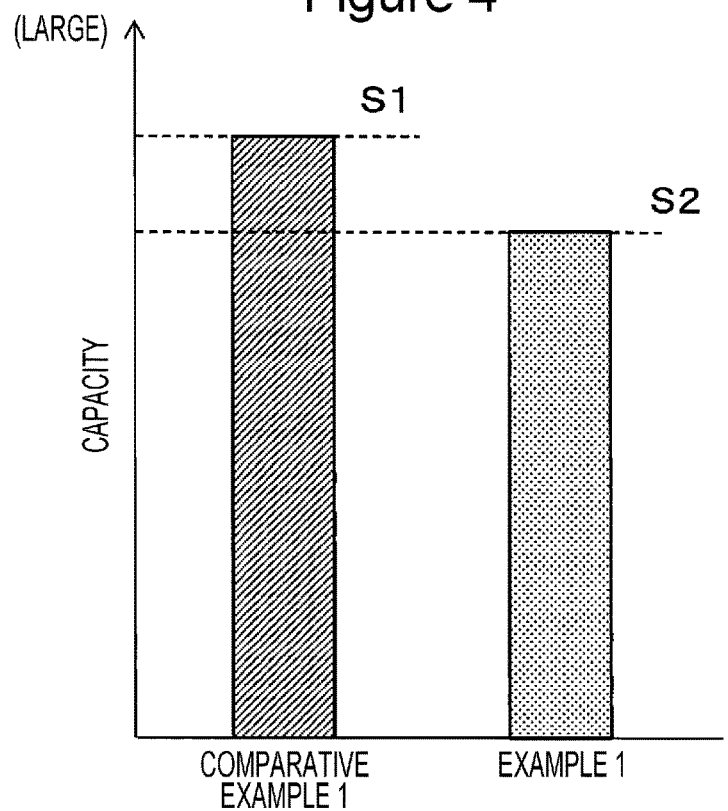
FIG. 4 is a graph illustrating the comparison of the charge capacity in the first cycle between Example 1 and Comparative Example 1.
Figure 5:
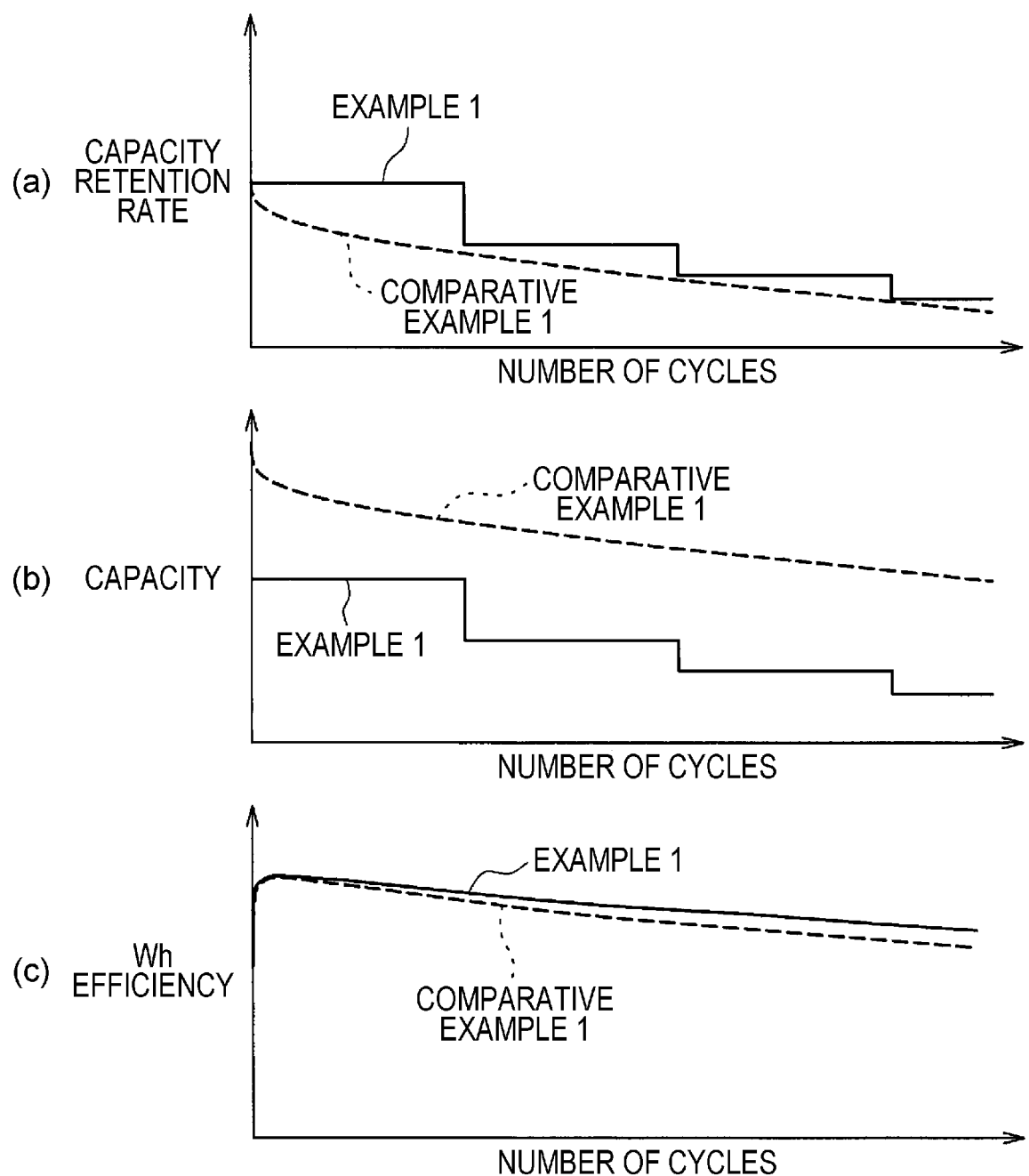
FIG. 5 is a view illustrating the relationship between each of the capacity retention rate (a), the charge capacity (b), and the charge-discharge efficiency (Wh efficiency) (c), and the number of cycles in Example 1, in comparison with that of Comparative Example 1.

FIG. 4 is a graph illustrating the comparison of the charge capacity in the first cycle between Example 1 and Comparative Example 1, and FIG. 5 is a view illustrating the relationship between each of the capacity retention rate (a), the charge capacity (b), and the charge-discharge efficiency (Wh efficiency) (c), and the number of cycles in Example 1 in comparison with that of Comparative Example 1. In Example 1, although the charge capacity in the first cycle is small compared to Comparative Example 1 as illustrated in FIG. 4 and FIG. 5 (b), the capacity retention rate and the charge-discharge rate are improved compared to Comparative Example 1 as illustrated in Table 2 and FIGS. 5 (a) and 5 (c). In FIG. 5 (a), the capacity retention rate of Example 1 is changed in steps because the charge termination capacity is changed every predetermined number of cycles.

As illustrated in Table 1, in Example 1, charging is performed based on a voltage (4.2 V per unit cell) higher than the voltage (4.1 V per unit cell) of Comparative Example 2 in the second pattern. Therefore, compared to Comparative Example 2 in which the charge capacity is substantially the same, CP charge region is increased, and thus the charging time is reduced. Further, as illustrated in Table 2, in Example 1, the degree of degradation of the secondary battery is confirmed in the first pattern, and then the charge conditions of the second pattern in the subsequent step are optimized. Therefore, improvement in capacity retention rate and charge-discharge efficiency after 1,000 cycles compared to Comparative Example 2 was confirmed. Although not illustrated in Table 2, in Example 1, improvement in charge-discharge efficiency has been confirmed from the early stage of the cycles, compared to Comparative Examples 1 and 2.

In Examples 2 and 3, the charge rate is reduced in accordance with the degree of degradation every predetermined number of cycles. Further, in Example 3, the discharge rate is also reduced in accordance with the degree of degradation. Therefore, in Examples 2 and 3, further improvement in capacity retention rate and charge-discharge efficiency from Example 1 was confirmed.

In Example 4, the second voltage V2 in the first pattern is increased from 4.1 V per unit cell of Example 1 to 4.15 V. Therefore, although the charge termination capacity in the second pattern is increased, both the capacity retention rate and the charge-discharge efficiency tend to be reduced compared to Example 1. However, compared to Comparative Examples 1 to 3, both the capacity retention rate and the charge-discharge efficiency in Example 4 are improved.

In Example 5, the first voltage V1 in the second pattern was reduced from 4.2 V per unit cell of Example 1 to 4.15 V, and therefore further improvement in capacity retention rate and charge-discharge efficiency from Example 1 was confirmed. In Example 5, compared to Example 1, since the charge capacity by CP charging is reduced, the charge capacity by CV charging is increased. Therefore, the charge time of the second pattern of Example 5 is longer than that of Example 1.

Note that in the charging system described above, as illustrated in FIG. 2, the charge termination capacity S2 is determined based on the full charge capacity that is based on the second voltage V2. However, in the case of setting the charge termination capacity S2 to a value less than the full charge capacity that is based on the first voltage V1 of the secondary battery, the charge termination capacity S2 can be set without being limited thereto.

Further, in the charging system described above, some of the functions of the control device may be provided by the state detector or the current sensor. For example, the detector may calculate the degree of degradation and the required charge amount.

REFERENCE SIGNS LIST 10 charging system
12 battery pack
14 secondary battery
16 state detector
18 current sensor
20 control device
21 charge capacity calculation unit
22 degradation degree calculation unit
23 charge control unit
30 charger

The invention claimed is:

1. A charging system for a secondary battery comprising:
a secondary battery;
a charger that charges the secondary battery;
a unit that calculates a charge capacity of the secondary battery; and
a charge control unit that controls the charger to perform a first charging step of charging the secondary battery until a first voltage is reached, and a second charging step of charging the secondary battery at a constant voltage of the first voltage,
wherein the charge control unit terminates charging when the charge capacity of the secondary battery reaches a charge termination capacity set in a range less than a full charge capacity that is based on the first voltage of the secondary battery,
the charging system further comprising:
a unit that calculates a degree of degradation of the secondary battery based on the DC resistance of the secondary battery,
wherein the charge termination capacity is changed based on a calculation result of the degree of degradation.

2. The charging system for a secondary battery according to claim 1, wherein the charge termination capacity is determined based on a full charge capacity that is based on a second voltage less than the first voltage.

3. The charging system for a secondary battery according to claim 2, wherein the second voltage is set in a range greater than or equal to 95% and less than or equal to 99% of the first voltage.

* * * * *